United States Patent [19]

Neely et al.

[11] Patent Number: 5,443,863
[45] Date of Patent: Aug. 22, 1995

[54] LOW-TEMPERATURE OXIDATION AT SURFACES USING OZONE DECOMPOSITION PRODUCTS FORMED BY MICROWAVE DISCHARGE

[75] Inventors: William C. Neely; William F. Welch; Raymond F. Askew, all of Auburn University, Ala.

[73] Assignee: Auburn University, Auburn, Ala.

[21] Appl. No.: 214,795

[22] Filed: Mar. 16, 1994

[51] Int. Cl.6 .............................................. B05D 3/06
[52] U.S. Cl. ................................... 427/579; 427/578; 427/575; 427/255.4; 437/239
[58] Field of Search ..................... 427/579, 578, 255.4, 427/575; 437/239

[56] References Cited

U.S. PATENT DOCUMENTS

4,409,260  10/1983  Pastor et al. .......................... 437/239
5,284,824   2/1994  Noda et al. ............................ 427/575

FOREIGN PATENT DOCUMENTS

3-201434  9/1991  Japan.

OTHER PUBLICATIONS

Tsukamoto et al, "Role of microwave oxygen plasma in the low-temperature growth of HoBa2Cu3Ox thin films", Physica C 181(1991) pp. 369–373.

Yamamoto et al, "Role of atomic oxygen produced by an electron cyclotron resonance plasma in the oxidation of $YBa_2Cu_3O_{7-x}$ thin films studied by in situ resistivity measurement", Appl. Phys. lett. 57(18) Oct. 1990, pp. 1936–1938.

L. Meuhlhoff et al, *J. Appl. Phys.*, 60, pp. 2558–2563. (1986).

E. Fitzer and R. Ebi "Silicon Carbide 1973", J. W. Faust, Jr., and C. E. Ryan, eds., University of South Carolina Press, Columbia, 1974, pp. 320–328.

C. H. Chou and J. Phillips, *J. Appl. Phys.*, 68, pp. 2415–2423 (1990).

*Primary Examiner*—Roy V. King
*Attorney, Agent, or Firm*—Eugene I. Snyder

[57] ABSTRACT

Decomposition of ozone in a microwave discharge cavity leads to formation of highly energetic excited states of atomic oxygen which can efficiently oxidize materials at a temperature far less than that needed for purely thermal oxidation. This technique can be applied to formation of films of silica at the surface of silicon and silicon carbide while maintaining quite moderate surface temperatures, often under 100° C. The technique can be used generally in a process to oxidize materials whose oxidation requires a standard free energy change of less than about +636 kJ/mol.

17 Claims, 3 Drawing Sheets

LOW-TEMPERATURE OXIDATION AT SURFACES USING OZONE DECOMPOSITION PRODUCTS FORMED BY MICROWAVE DISCHARGE

BACKGROUND OF THE INVENTION

Silicon carbide has been known for more than 100 years and originally was formed by passing a strong electric current from a carbon electrode through a clay mixture. From the outset its abrasive qualities were judged outstanding, leading to the founding of The Carborundum Company in a development important to the abrasives industry. With time other qualities of silicon carbide were exploited, but its uses remained restricted largely to the metallurgical, abrasive, and refractory industries. More recently silicon carbide has been used as an important structural ceramic where its corrosion resistance and wear resistance may be advantageously employed.

Silicon carbide also is a semiconductor, having a conductivity intermediate to metals (conductors) and insulators or dielectrics, with a large band-gap at 300° C. of about 2.2 eV for the cubic forms and about 2.86 eV for the non-cubic forms. Its excellent physical and electrical properties make it a candidate for the fabrication of electrical devices that can operate at significantly higher temperatures compared to devices based on silicon or on gallium arsenide. This wide band-gap semiconductor shows desirable properties such as chemical stability even at several hundred degrees centigrade, high thermal conductivity, high breakdown electric field, and high saturated electron drift velocity, all of which make silicon carbide a very attractive material for high temperature, high frequency, and high power electronic devices.

A brief word regarding terminology is in order before proceeding. Silicon carbide may crystallize in cubic, hexagonal, or rhombohedral structures. The cubic structure is referred to as $\beta$-SiC, appears to exhibit only one polytype, and sometimes is designated as 3C-SiC. In contrast, there are a multitude of hexagonal and rhombohedral structures, where these non-cubic structures collectively are referred to as $\alpha$-SiC. The hexagonal polytypes are designated as H-SiC and the rhombohedral-polytypes are designated as R-SiC. The most commonly studied polytype appears to be that designated as 6H-SiC. This is prepared by sublimation according to methods well known in the art and which will not be further discussed here. For the purpose of this application it is sufficient to note that various polytypes are known, are well described, and are not only readily made according to procedures taught in the prior art but also are readily available from several commercial sources. The various polytypes arise from long range order in the crystal but additional discussion here is unneeded since in practice our invention is independent of SiC polytypes.

Before silicon carbide can gain wide acceptance as a semiconductor it is necessary to develop methods of preparing $SiO_2$ films at its surface and to prepare such films with a uniform, controlled thickness, without defects, and in a predictable fashion. Films of $SiO_2$ act as the medium for the selective etching and film deposition essential in the fabrication of electronic devices, especially those of large scale integration (LSI) and very large scale integration (VLSI) design.

The thermal oxidation of silicon carbide to form films of $SiO_2$ has been studied many times in recent years, especially at temperatures between about 1000° and 1400° C. For example, Meuhlhoff and coworkers studied the oxidation of clean surfaces of silicon carbide at both the carbon-rich face, SiC(000$\bar{1}$), and the silicon-rich face, SIC(0001), and found that at 995° C. oxidation was approximately equal at both surfaces. L. Meuhlhoff and coworkers, *J. Appl. Phys.*, 60, 2558 (1986). They also confirmed that silica forms a protective layer for further oxidation which becomes controlled by diffusion of the reactant (oxygen) and reaction product (carbon monoxide) through the oxide layer.

Earlier E. Fitzer and R. Ebi ("Silicon Carbide 1973", J. W. Faust, Jr., and C. E. Ryan, editors, University of South Carolina Press, Columbia, 1974) had shown that at a low oxygen potential at the $SiO_2$/SIC interface the reaction of SiC with $SiO_2$ leads to the formation of volatile SiO and CO. At low oxygen partial pressure in the primary stage SiO is formed at once which causes catastrophic oxidation. Meuhlhoff and coworkers also have shown that at 1300° C. Si(g) vaporization from the carbon-rich face leads to extensive carbon enrichment and surface graphitization; *J. Appl. Phys.*, 60, 2842 (1986).

Unfortunately the high temperature thermal oxidation of silicon carbide to form a silica film is fatally defective. It is extraordinarily difficult, if not impossible to obtain a uniform coat with good electrical qualities when the substrate is heated at a temperature greater than 600°-700° C. as required by the prior art. Certain oxidants, such as nitric acid, lead to occlusions in the coatings and other imperfections. It also is extremely difficult to obtain layers of well defined thickness using prior art methods.

In a search for a low-temperature method of oxidizing silicon carbide to form silica films, we have found that the product stream from microwave discharge induced decomposition of ozone is quite effective in oxidizing silicon in both silicon carbide and silicon films to form a silica film at temperatures under 200° C. Using ozone as the feed gas for a microwave discharge plasma it is possible to produce localized, high concentrations of excited oxygen atoms near, e.g., a silicon carbide surface which through the subsequent reaction of the atomic oxygen with silicon leads to quite uniform coatings of silica on the SiC surface. Using the method which is our invention it is possible to produce silica layers of well defined thickness through control of various oxidation parameters. Because oxidation is done rapidly and at a comparatively low temperature, the semiconductor characteristics of the underlying silicon carbide remain unaltered. The silicon oxide films which are formed are relatively free of imperfections and their thickness can be readily controlled. Thus, the method which is our invention promises to bring silicon carbide from the realm of unfulfilled potential into the world of accomplished reality by making it possible to produce uniform films of $SiO_2$ with relatively few imperfections in a manner which readily lends itself to controlling film thickness without adversely affecting the semiconductor properties of the underlying silicon carbide.

Although our initial labors concerned the formation of silica films on silicon carbide, that accomplishment, however significant it may be, is dwarfed by the more general observation that the product stream from microwave discharge induced decomposition of ozone is a powerful oxidant for a broad variety of otherwise oxidation-resistant materials at quite modest temperatures. Thus our invention in its broadest aspect is a novel method of oxidizing surfaces at relatively low temperatures, and is particularly important for the oxidation of surfaces which are readily oxidized only at relatively high temperatures of several hundred degrees centigrade. As we explain within, although our oxidations are performed at low temperatures, say, under 100° C., oxidation proceeds as if the temperature were several thousands of degrees. This assumes special significance when the material, or rather the surface of the material, sought to be oxidized is itself thermally labile, whether structurally or chemically. The ramifications of our invention are many and will be better understood from the following exposition.

SUMMARY OF THE INVENTION

A specific purpose of this invention is to form a film of silicon dioxide substantially free of imperfections in a controlled, reproducible manner on the surface of silicon-containing solids such as silicon and silicon carbide. An embodiment comprises decomposing ozone in a microwave discharge cavity and directing the ozone decomposition product stream at the surface of the silicon-containing solid at a temperature under about 300° C. In a more specific embodiment the silicon-containing solid is silicon carbide. In a further specific embodiment the silicon dioxide film formed has a thickness between about 300 and about 1500Å. In a still further embodiment the temperature at all times is less than about 100° C.

In its broader aspect our invention is a method of oxidizing a material, especially at temperatures under about 100° C., using the ozone decomposition products formed in a microwave discharge cavity. An embodiment different from the foregoing ones is the oxidation of diamond. Other purposes and embodiments will be clear from the ensuing description.

DESCRIPTION OF THE INVENTION

Figure 1:
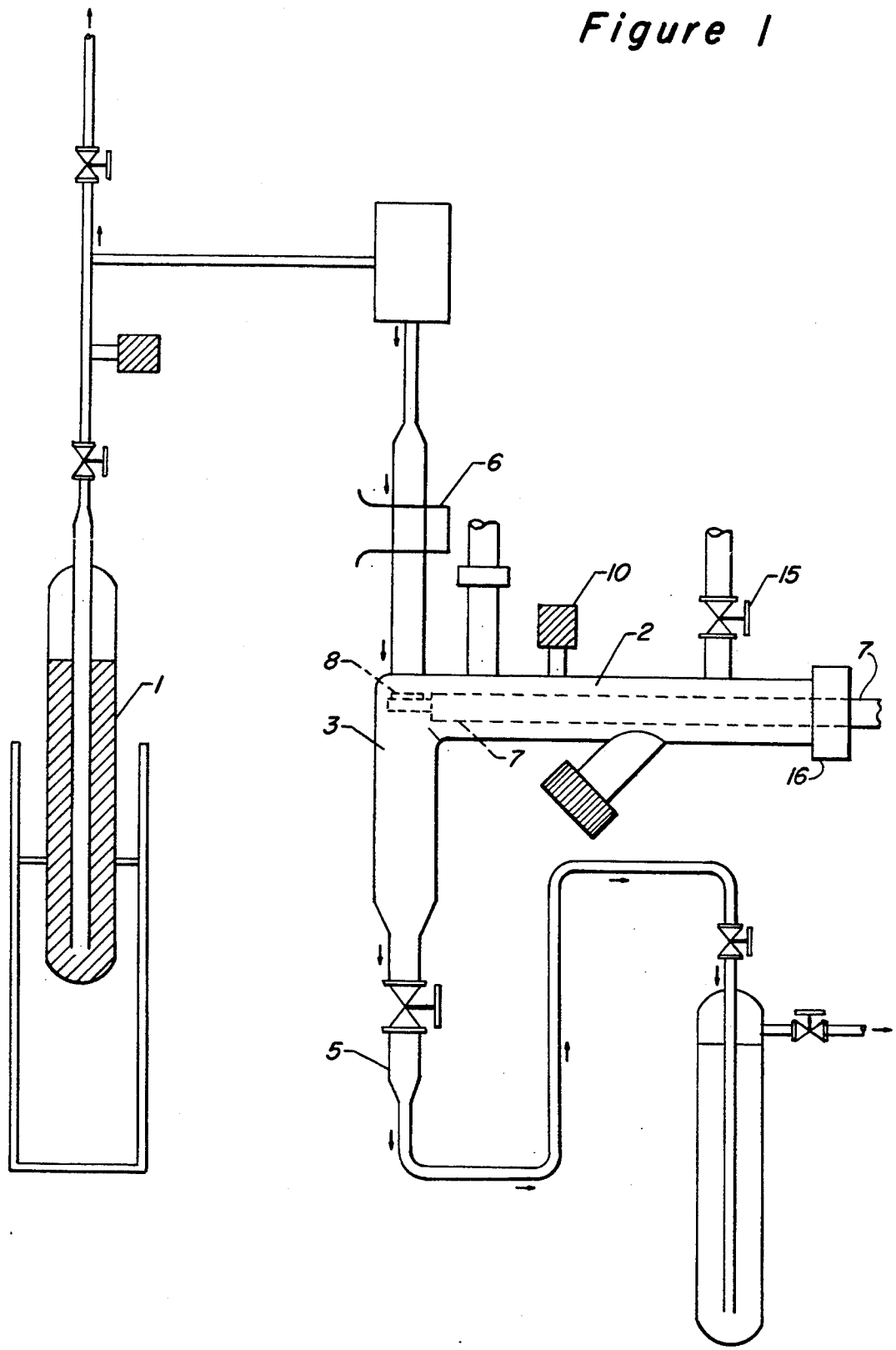
FIG. 1 is a schematic diagram of the apparatus used to expose materials to a predetermined flux of excited state molecular and atomic oxygen with controlled exposure time and temperatures.

The formation of an excited state of an atom or molecule, i.e., a state whose energy is higher than the "normal" or ground state of the species, often can be utilized to promote a chemical reaction such as oxidation. In part this is because the excited state of a species has an "effective temperature" T which is related to the energy E of the excited state by $T = E/k$, where k is Boltzmann's constant. This translates to an effective temperature of 11,605° K/eV, where eV is the energy of the excited state in electron volts. Since ozone has a standard free energy of formation $(\Delta G^{\circ}_f) = +1.7$ eV with respect to molecular oxygen (defined as zero), it occurred to us that using ozone as a source of excited oxygen species would be inherently advantageous relative to using molecular oxygen as a source.

As to means of producing excited oxygen species, ultraviolet photolysis of either ozone or oxygen poses difficulties. The direct excitation of $O_2$ to yield $O_2(^1\Delta_g)$ is spin forbidden and does not occur. Similarly, the direct production of $O_2(^1\Sigma+)$ by photolysis of molecular oxygen is negligible. The photolysis of $O_2$ to produce oxygen atoms in the ground and two lowest excited states requires the threshold wavelengths (or shorter) shown below:

| REACTION | THRESHOLD WAVELENGTH (ANGSTROMS) |
|---|---|
| $O_2 \rightarrow O(^3P) + O(^3P)$ | 2425 |
| $O_2 \rightarrow O(^3P) + O(^1D)$ | 1750 |
| $O_2 \rightarrow O(^3P) + O(^1S)$ | 1332 |

All of the above wavelengths are prohibitively expensive to generate in the intensities needed for practical photolysis.

The primary products of the photolysis of $O_3$ in the region of its strongest absorption band, centered on 2500 A, are:

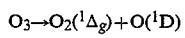

$$O_3 \rightarrow O_2(^1\Delta_g) + O(^1D)$$

Again, the required 2500 A ultraviolet light is expensive to generate and, moreover, the absorption of light by $O_3$ even in this maximum absorption band, is quite low; at 0.1 torr no more than about 3% of the incident light would be absorbed by ozone in a 1 cm path length. In contrast a microwave discharge at 2450 MHz contains a flux of electrons having a distribution of energies centered at ca. 5 eV. An enthalpy change of 9.4 eV is required for production of one $O(^3P)$ and one $O(^1S)$ atom from $O_2$ but a net enthalpy change of only 3.5 eV is required for production of one $O_2(^1\Delta_g)$ molecule and one $O(^1S)$ from $O_3$. Clearly, it is advantageous to use a microwave discharge for production of higher energy states of oxygen with ozone as the source.

As to the various excited states which may be expected to form in a microwave discharge plasma of ozone one may mention $O_2(^1\Delta_g)$ and $O_2(^1\Sigma g)$ as molecular oxygen species. Both $O(^1D)$ and $O(^1S)$ atomic oxygen may be formed at energies of 1.97 and 4.19 eV, respectively above the ground state of atomic oxygen, $O(^3P)$. Ionic species also can be expected to be found in the discharge (see C. H. Chou and J. Phillips, *J. Appl. Phys.*, 68, 24 15-2423 (1990)), although for reasons elaborated upon below these are believed not to be important in the oxidations we report herein. To actually atomize ordinary (ground state) molecular oxygen to produce one ground state oxygen atom and one $O(^1S)$ excited state would require 9.4 eV, whereas production of one excited oxygen molecule, $O_2(^1\Delta_g)$, and one excited oxygen atom, $O(^1S)$, from ozone requires a net enthalpy change of only 3.5 eV, which is well within the spectrum of energies available from the microwave discharge.

We believe that $O(^1S)$ is the principal oxidizing agent under the conditions we report herein based on the following. We have observed that oxidation is sharply limited by the distance between the discharge cavity outlet and the sample, which implies that the reactive species, or at least the reactive species most responsible for the observed oxidation, has a short lifetime. Since ion concentrations are reported to be high throughout the region of visible red glow emerging from a microwave cavity operating a discharge in oxygen (C. H. Chous et. al., op. eit.) and since rapid oxidation occurs only in a region proximate to the cavity exit, the likelihood of ionic species being responsible for oxidation seems remote. Ground state oxygen, $O(^3P)$, is long lived and probably would persist throughout the glow, which makes it unlikely that it contributes materially to the oxidation. Similar reasoning holds for the excited molecular species $O_2(^1\Delta g)$ and $O_2(^1\Sigma g)$. Consequently the most likely species causing oxidation are the atomic oxygen species $O(^1D)$ and $O(^1S)$.

The lifetime of $O(^1D)$ is too short to permit it to reach the sample before it decays to ground state atomic oxygen, which we have seen above is unreactive in our experiments. However, $O(^1D)$ can be produced from relaxation of the longer-lived $O(^1S)$ state. Thus, $O(^1S)$ appears to be the critical excited state, whether it is the proximate oxidant or merely as a source of $O(^1D)$ as the oxidant. Stated differently, we believe that the surface oxidations we have observed depends on the formation of $O(^1S)$, hence it is the indispensable prerequisite in the successful practice of our invention. However it is to be noted that although this appears to us to be the most plausible hypothesis the success of our invention is not dependent upon the accuracy of our hypothesis, for our invention is to use the products formed in the microwave decomposition of ozone, which can readily be seen to be independent of the precise knowledge of the species present.

Our invention is based on two interrelated observations. The first is that the decomposition products of energetic ozone are quite effective in oxidizing a broad variety of materials, including the silicon in silicon-containing materials to silicon dioxide. The second observation is that a microwave discharge into a flowing ozone stream very efficiently introduces the energy required for decomposition of ozone with formation of highly energetic oxidants, excited oxygen atoms and molecules. Comparatively less microwave energy must be coupled into an ozone plasma relative to an oxygen plasma system, thus producing less thermal heating because of the energy contribution from the decomposition of ozone. Since the decomposition reaction is virtually irreversible the efficiency of ozone decomposition in a microwave discharge is very high. The discharge in ozone produces a uniquely high concentration of species effective in oxidizing surface materials, such as silicon to silicon dioxide, at comparatively low temperatures, frequently under 100° C. but certainly under 300° C., so that heat sensitive sample surfaces are unaffected. Low temperature oxidation occurs very rapidly because of the relatively high concentration of reactive oxygen species which can be formed. Silicon dioxide films can be produced at silicon-containing surfaces with a well controlled thickness and the formed films are substantially free of imperfections which often accompany high-temperature oxidation methods. It also is possible to etch rough diamond surfaces under moderate conditions at reasonable cost, as another example of the efficacy of our invention.

The solids of particular interest in the practice of this invention are those otherwise resistant to oxidation except at temperatures in excess of 300° C. That is, even though oxidation using the method which is our invention is almost limitless, our invention is particularly valuable when applied to materials which are oxidation resistant at temperatures under about 300° C. The thermodynamic possibility of oxidation of a substance by atomic oxygen depends on the relative Gibbs free energy ($\Delta G$) available in the oxidizing species and the free energy requirement for oxidation. The materials which can be oxidized according to our invention include, in principle, all substances having an oxidation step which requires a standard free energy change no greater than 636 kJ/mol of oxygen atoms reacted, since this is the free energy available in one mole of $O(^1S)$ atoms. This would include, e.g., the oxidation of silicon, silicon carbide, diamond, copper, aluminum, and any other material whose oxidation requires a free energy change of no greater than 636 kJ/mol. In practice the extent of oxidation by atomic oxygen of any solid which forms a solid oxide on its surface depends not only on the thermodynamic factor, $\Delta G$, but also on the kinetic factor of the rate of penetration of the oxidizing species through the formed solid oxide layer to reach the unoxidized surface where any additional reaction must occur. In the case of diamond and other carbon compounds the oxide(s) are volatile and this possible limitation to the rate of oxidation is not present. We point out again that the invention described within is applicable to both the $\alpha$ and the $\beta$ forms of silicon carbide, and to all the polytypes which $\alpha$-SiC displays.

The aforementioned materials are oxidized by reactive species contained in an ozone-decomposition stream produced in a microwave discharge. The ozone used in the practice of our invention may be produced in any feasible manner; as a practical matter the ozone pressure should not be greater than about 1 torr. An increase in ozone pressure would be expected to result in the generation of a higher concentration of excited oxygen species, likely by a unimolecular process, a process proportional to pressure. However, quenching of the excited states of oxygen believed to be responsible for the oxidation is a collisional process, a bimolecular reaction where the rate of quenching is proportional to the square of the concentration of gaseous species, or the square of the pressure. Consequently although the reason why higher pressures are detrimental is clear, the practical limit of 1 torr. results only from experimental observations.

It should be emphasized that the concentration of atomic species formed in a discharge process is governed by the interaction of several factors which have been discussed in the microwave discharge-induced decomposition of molecular oxygen by M. Brake et. al., *Plasma Chemistry and Plasma Processing*, 3, 63–67 (1983). The increase in species with applied microwave power needs no further comment. A low flow rate of feed gas into the microwave cavity increases residence time in the plasma region and increases the probability of formation of excited states of atomic oxygen. A high flow rate decreases the residence time between the exit of the discharge reactor and the sample so that quenching of the excited states via bimolecular collisions and wall collisions prior to the reactive collision of the excited state species with the sample becomes less probable. The effect of pressure has been briefly discussed above. We mention in passing that the overall quenching rate of $O(^1S)$ can be calculated, at least approximately, under a set of experimental conditions to determine the distance from the microwave discharge exit at which half of the generated excited states still remain. Thus, in a general qualitative manner one can predict the change in concentration of atomic oxygen species with experimental variables, but the interdependency of the variables makes an experimental determination the only practical alternative.

The aforedescribed ozone stream is then introduced into and decomposed in a microwave discharge cavity. Even a low power microwave discharge on the order of 50 watts is sufficient in effectively decomposing ozone to the desired decomposition product. The commercially permissible microwave frequency at 2450 MHz has been found to be a quite acceptable energy source. This is not to say that this is the optimum microwave frequency to be employed, but rather merely demonstrates that the commercially permitted microwave frequency is adequate to effect ozone decomposition. In our view the particular microwave frequency employed is not a critical aspect of our invention and any microwave frequency may be utilized.

The stream exiting the microwave discharge cavity is referred to as the ozone decomposition product stream and consists virtually exclusively of molecular oxygen and atomic oxygen, each in excited states. Molecular oxygen in the product decomposition stream is found in the $^1\Delta_g$ state, which is about 1 eV more energetic than the triplet ground state of molecular oxygen. Part of the atomic oxygen in the ozone decomposition product stream is in the excited $^1D$ state, which is about 1.9 eV more energetic than its triplet ground state $^3P$, and part is in the $^1S$ state, which is about 4.2 eV, still more energetic. Although any of the foregoing species may react with materials at a surface, it is believed likely that at least the major part of the oxidation is effected by $O(^1D)$ and $O(^1S)$, and as explained previously we believe it is more likely that $O(^1S)$ is the major oxidant.

The ozone decomposition product stream exiting the microwave discharge cavity is produced at relatively low temperatures, under approximately 100° C. This product stream is then directed at a surface of a solid where the surface also is maintained at a temperature preferably less than about 100° C. Under these conditions oxidation of, e.g., silicon to silicon dioxide is quite rapid and affords films virtually free of substantial imperfections. Although the ozone decomposition product stream is at a temperature under about 100°, it should be obvious that it is not necessary that the temperature of the surface be so limited in order for oxidation to occur, but it should be equally obvious that advantages accrue from limiting the surface temperature. We prefer that the surfaces oxidized remain under about 300° C., better yet under about 200° C., even more preferably under about 100° C., and most preferably under about 75° C. In practice oxidations usually are conducted at temperatures in the range 0°-200° C., even more often in the interval 20°-100° C., but it needs to be emphasized these temperatures do not result from a limitation, but rather represent convenient operating conditions.

The path length between the exit of the microwave discharge zone and the surface of the silicon-containing material is critical. Excited atomic oxygen has a short lifetime and in the absence of collisions decomposes in a zero order reaction. However, its decomposition rate also is dependent upon collisions, and therefore the rate of decomposition is quite dependent upon total pressure. The concentration of atomic oxygen decreases sharply with distance from the exit of the microwave discharge zone because of wall collisions and collisions with other gaseous molecules. The higher the pressure in the system, the closer must be the surface of the silicon-containing material to the microwave discharge exit for maximum utilization of excited atomic oxygen. At lower system pressures the distance between the silicon-containing surface and the microwave discharge exit can be increased because the fraction of singlet oxygen surviving at a given distance from the exit is increased. Therefore, one can have a larger distance between the microwave discharge exit and the silicon-containing solid surface while still having effective utilization of the excited atomic oxygen initially formed. However, at lower pressures there also is a lower flux of excited atomic oxygen. Since the rate of oxidation of silicon to silicon dioxide increases with the increase in concentration of excited atomic oxygen, a high flux and therefore a short path length is most desirable. Under the experimental conditions we have employed (vide infra) we estimate that about 50% of $O(^1S)$ remains at a point 6 mm from the exit of the microwave discharge cavity.

The following exemplifies one manner of practicing the claimed invention and is intended to be illustrative only. Our invention is not intended to be circumscribed, or in any way limited, by the following description, for the man of ordinary skill in the art will recognize other variants, all of which are intended to be subsumed by our invention.

PROCEDURES

Sample Preparation

The silicon carbide films used in these experiments were a mixture of 15R and 6H types obtained from Cree Research. These films were given an initial cleaning in ethyl alcohol or acetone, blown dry with nitrogen, and then etched in a dilute solution of HF to remove any oxide initially present. From this acid solution the films were then rinsed in distilled water and blown dry with nitrogen.

Separation of Ozone from Oxygen

Ozone was separated from oxygen by an established method of passing the ozone-oxygen mixture from a laboratory ozone generator through a vessel containing refrigerated silica gel which adsorbs the ozone but not the oxygen. A stream of a dry oxygen-ozone mixture at atmospheric pressure was passed through a vessel containing untreated but dry silica gel and immersed in a dry ice/acetone bath kept at a constant, known temperature. The dilute stream of ozone in oxygen was passed through the bed of silica gel until the concentration of ozone in the off-gas was equal to that in the entering gas. The ozone-oxygen flow was then stopped, the vessel was evacuated for several minutes, and the reservoir of adsorbed ozone was then closed off and stored at dry ice temperature for use as needed.

Apparatus for Atomic Exposure of Samples to Oxidizing Gases

The schematic diagram of the apparatus used in conjunction with the oxidizing gas source used to expose materials, such as a silicon carbide film, to a predetermined flux of excited state molecular and atomic oxygen with controlled exposure times and temperatures is shown in FIG. 1. The system consisted of the ozone reservoir 1 discussed above, an isolation chamber 2 for inserting and removing the sample, a reaction chamber 3, a temperature probe 4 for measuring sample temperature, a microwave discharge cavity 6, and a removal system 5 for the gases.

Reaction Chamber

Figure 2:
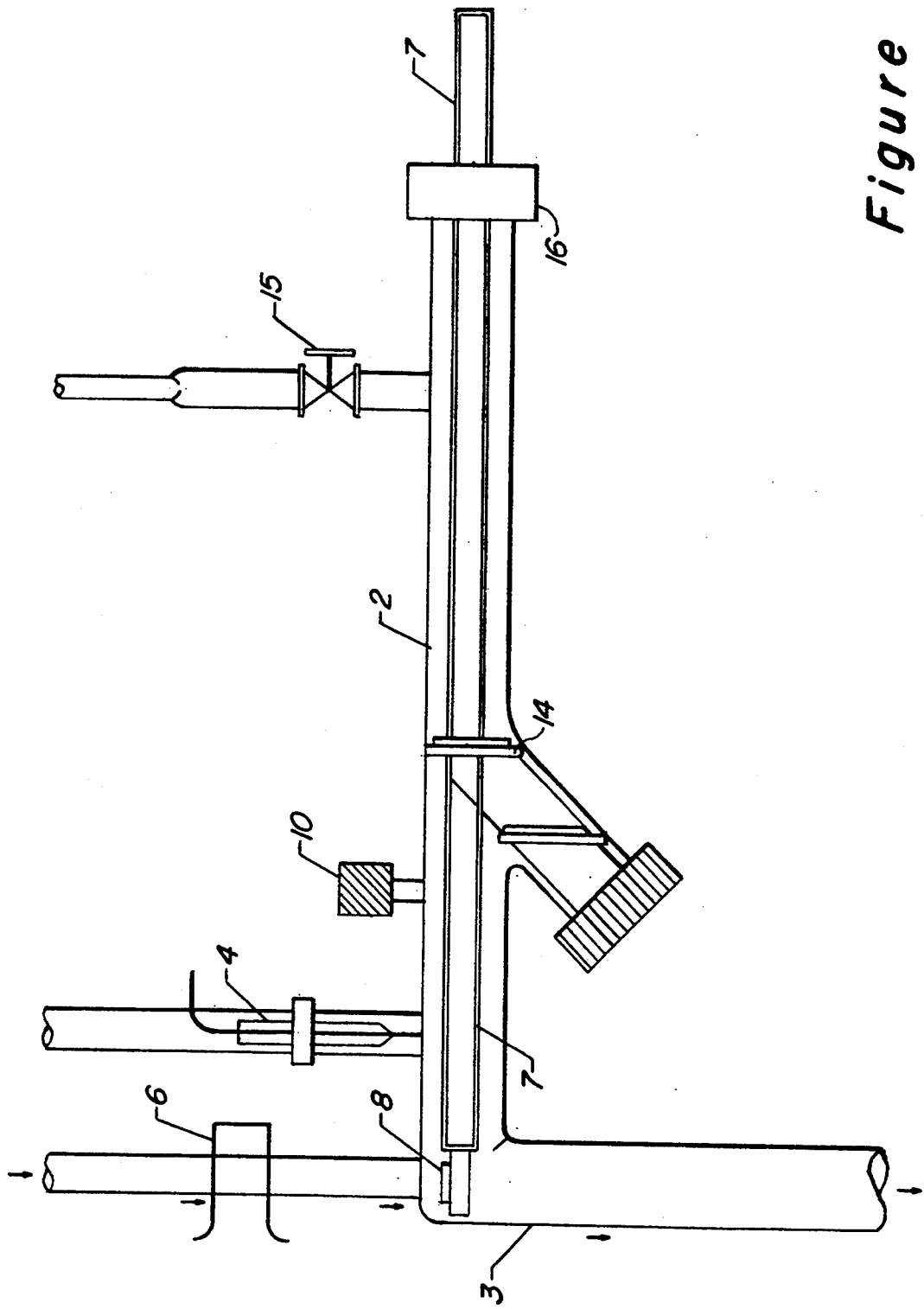
FIG. 2 is an enlarged view of the reaction chamber.

The reaction chamber 3 is the area where the oxidation of the silicon carbide takes place. It is located directly below a microwave discharge cavity 6, which generates a plasma in an atmosphere of pure flowing ozone and is adjacent to the isolation chamber 2. FIG. 2 is an enlarged view of the reaction area under reaction conditions showing a sample handler 7 with the sample 8 at a terminus, an isolation chamber 2 a temperature probe 4 and pressure gauge 10 to monitor the pressure of the system.

Figure 3:
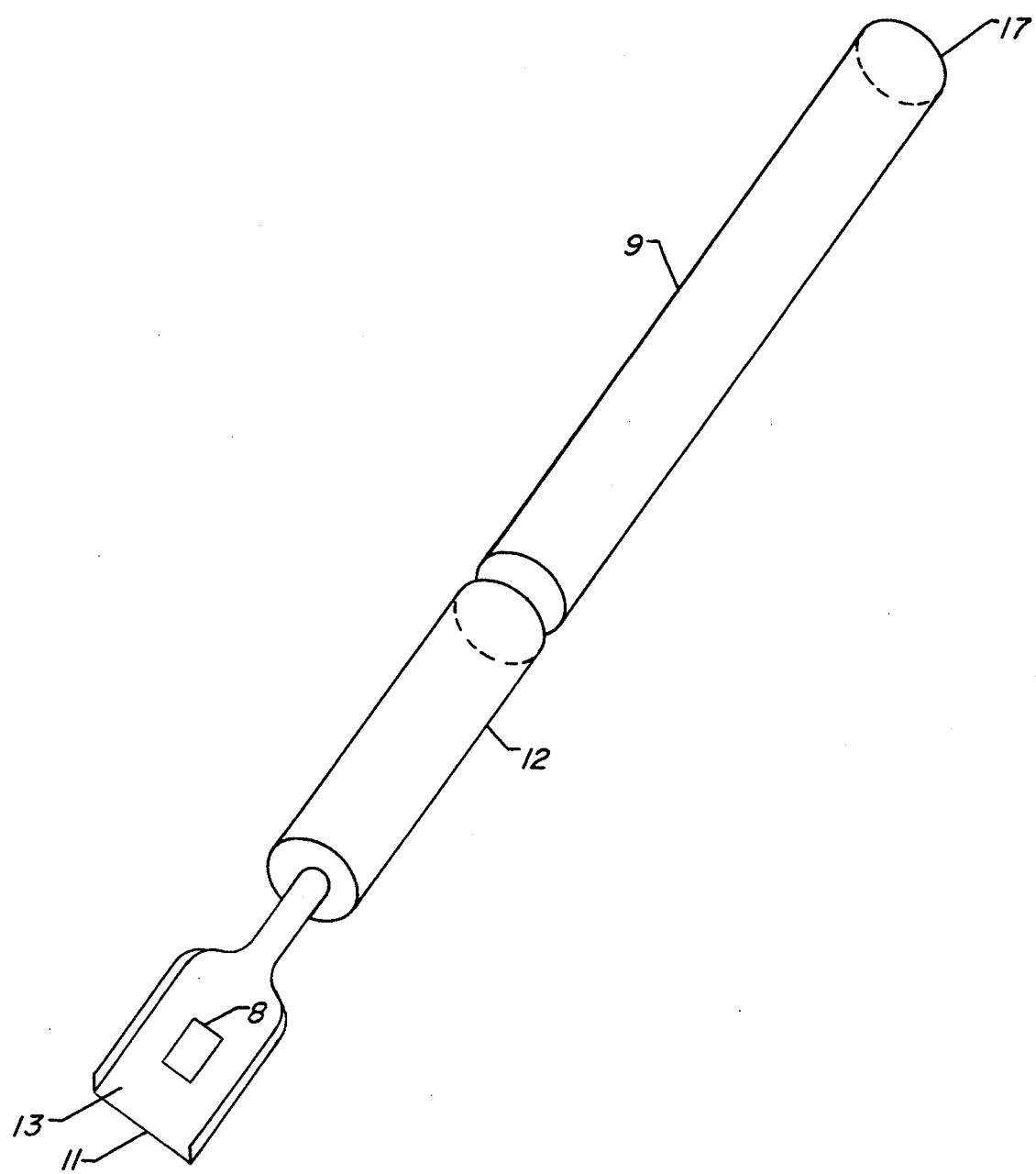
FIG. 3 is an enlarged view of the sample holder.

The sample handler, shown separately in FIG. 3, consists of a long pyrex tube 9 joined to a quartz rod 12 which ends with a flat plate 11 having a 1/16" groove, was used to introduce the SiC sample into the reaction zone and to hold it there during oxidation. The sample 8 rests on the flat plate 11, held on by gravity. The surface 13 of the plate was roughened by grinding to aid in holding the sample. The end of the pyrex tube 9 was open at terminus 17 to allow insertion of cartridge heaters or additional temperature probes if required, although neither were actually needed in these experiments.

The isolation chamber 2 functions to isolate the sample from the oxidizing gases until the sample is ready to be introduced. A Flickett valve 14 is used to separate the oxidizing gas system from the sample handler holding, e.g., the silicon carbide sample until the reaction is to begin. The vent valve 15 to which a vacuum pump was connected, is used as needed for either evacuating the isolation chamber to the pressure of the reaction system prior to inserting the sample or for venting the system to atmospheric pressure when removing the sample. The isolation chamber is fitted with an Ultra-Torr connector 16 so that the sample handler could be moved by sliding it through this fitting.

The temperature of the reaction chamber was monitored at 4 by a Type K thermocouple probe positioned at a right angle to the sample probe. Temperature readings were recorded by an Omega Mod. 6072K model temperature controller. The temperature was recorded by removing the sample from the reaction chamber and then quickly positioning the sample at the pyrex probe containing the thermocouple.

EXAMPLE 1

Operation of the oxidation system using SiC samples

When ozone enters into a microwave discharge cavity operating at 2450 Mhz the ozone is excited and the molecules dissociate into excited atomic oxygen $O(^1D)$ and $O(^1S)$, plus excited molecular oxygen, $O_2(^1\Delta_g)$. The oxygen atoms and molecules pass into the reaction chamber, where they react with the SiC positioned directly under the gas flow.

For optimum oxidation of the SiC surface, the position of the probe head in the reaction chamber was found to be critical. A vertical direction for the gas flow was used with the sample held horizontally on a sample holder and introduced through a side arm tube set at 90° to the direction of the gas flow at a point below the microwave discharge. The distance between the discharge and the sample introduction point was varied to minimize the temperature of the sample while keeping the transit time from discharge to sample short enough to ensure survival of a significant concentration of excited states of oxygen atoms. To provide a well characterized time of exposure of the samples to the atomic oxygen flux, the sample was protected from the atomic oxygen environment by holding it in an isolation chamber formed in the side arm tube by a wide bore Flickett shutoff valve. When the oxidation was to begin, the isolation chamber was evacuated to the pressure of the reaction chamber, the Flickett valve opened, and the sample inserted perpendicular to the gas flow. The sample holder with sample was positioned directly under the gas flow at approximately $\frac{1}{8}$ inch from the vertical small tube around which was the microwave cavity and in which the plasma discharge was occurring. The position of the cavity from the sample was $1\frac{1}{4}$ inches. The reaction chamber temperature was 65° C., which was the total exposure time at an ozone flow rate of 5 ml/min, and the sample temperature after 15 minutes was 87° C. In other runs the temperature of the SiC sample ranged up to 100° C.

A cold trap was located between the discharge system and the vacuum pump to prevent backstreaming of oil which could contaminate the sample. The pressure throughout the system was maintained at approximately 0.2 torr during operation. When the experiment was completed, the sample was positioned directly below the thermocouple probe and the temperature of the sample obtained and recorded. Following this, the samples were removed from the system for subsequent analysis by Rutherford Back Scattering (RBS) for determination of oxide layer thickness and by electron depth profiling for determination of the electrical insulation quality.

The results for Rutherford Backscattering (RBS) analysis showed that the oxidation of carbon-faced SiC produced 1,000 to 11,200 angstroms of $SiO_2$ in 15 minutes exposure time to a maximum possible concentration of total atomic oxygen, regardless of its electronic state, estimated to be about $1 \times 10^{-5}M$. This estimate results from assuming the total decomposition of the known amount of ozone passing into the discharge, and that one oxygen atom was produced from each ozone molecule decomposed. Thus, concentrations of atomic oxygen species could be less than this figure, but not higher. The exposure of the silicon-faced sample for 15 minutes to the same atomic oxygen environment resulted in the formation of an oxide layer 300 angstroms thick. The film thickness appeared somewhat greater in the center of the film than at the edges indicating that the reactive oxygen species concentration was greater at the center than at the edge, probably because gas collisions with the wall of the reaction tube had deactivated some of the excited oxygen atoms forming a sheath of atoms at lower and less reactive energy states so that the edges of the samples were less oxidized than the centers. Using approximations of oxide film dimensions and atomic oxygen flux we estimate that the oxide formation in the case of C-faced SiC, is about 1.7% of the atomic oxygen produced. Scaling factors are difficult to estimate but it is not unreasonable to expect the efficiency to increase with the square of the diameter of the reaction system. This would amount to an efficiency of ca 40% using a tube diameter of 50 mm instead of the present 10 mm.

EXAMPLE 2

Oxidation of a silicon film

Silicon was oxidized using the same basic reaction system as for the SiC oxidation. However, in order to provide a more uniform atomic oxygen flux which had less difference in atomic oxygen concentration between the edges and the center of the flow, a larger diameter reaction chamber was used. The effect was to provide a more uniform flux but one of lower density of oxidizing species. Therefore, although it is known that Si is easier to oxidize than SiC when conditions are the same, the actual reaction times required to provide given sample thicknesses are greater in these experiments with silicon than in the previous ones with SiC.

TABLE 1

Oxidation of Silicon by Excited Atomic Oxygen Flux

| Exposure Time in Minutes | Oxide Layer Thickness in Angstroms |
| --- | --- |
| 15 | 373 |
| 30 | 565 |
| 45 | 754 |
| 60 | 910 |
| 90 | 1,225 |
| 120 | 1,545 |
| 180 | 1,750 |

EXAMPLE 3

Oxidation of diamond; diamond etching

Two different tests were made for oxidative etching of diamond by excited atomic oxygen.

Experiment (i)

Commercially obtained natural diamond power was exposed to the atomic oxygen flux for a period of 15 minutes. Microscopic examination of the powder (825X magnification) showed that before oxidation the particles were quite blocky, that is the thickness was comparable to the length or width. After oxidation the particles were greatly etched and many were thinned to a very small thickness.

Experiment (ii)

A free-standing synthetic diamond film set in a silicon frame was exposed to the atomic oxygen flux for 45 minutes. The original thickness of the film was about 13 microns. After 45 minutes exposure the sample was completely oxidized and none remained.

What is claimed is:

1. A method of forming a film of silicon dioxide at a surface of a silicon-containing solid comprising reacting at a temperature under about 300° C. the silicon-containing solid with an ozone decomposition product stream formed by the decomposition of ozone at a pressure up to about 1 torr in a microwave discharge cavity, said product stream containing excited molecular oxygen and excited atomic oxygen selected from the group consisting of $O(^1D)$, $O(^1S)$ and combinations thereof.

2. The method of claim 1 where the silicon-containing solid is selected from the group containing silicon carbide and silicon.

3. The method of claim 1 where the temperature is between about 0° C. and about 200° C.

4. The method of claim 3 where the temperature is between about 20° C. and about 100° C.

5. A method of forming at a temperature of under 300° C. a film of silicon dioxide at a surface of a silicon-containing solid comprising:

a) leading a stream of ozone at a pressure of up to about 1 torr into a microwave discharge cavity;

b) decomposing the ozone in said stream in said microwave discharge cavity to produce an ozone decomposition product stream Containing excited singlet molecular oxygen and excited atomic oxygen;

c) directing the ozone decomposition product stream containing excited atomic oxygen selected from the group consisting of $O(^1D)$, $O(^1S)$ and combinations thereof, at the surface of said silicon-containing solid to form said film of silicon dioxide on said surface, the surface having a temperature never in excess of 300° C.; and d) recovering the silicon-containing solid with the film of silicon dioxide at said surface thereof.

6. The method of claim 5 where the silicon-containing solid is selected from the group consisting of silicon carbide and silicon.

7. The method of claim 6 where the temperature is between about 0° C. and about 200° C.

8. The method of claim 4 where the temperature is between about 20° C. and about 100° C.

9. A method of forming a film of silicon dioxide at a surface of a silicon-containing solid comprising reacting at a temperature less than about 300° C. the silicon at the surface of the silicon-containing solid with excited atomic oxygen selected from the group consisting of $O(^1D)$, $O(^1S)$ and combinations thereof.

10. The method of claim 9 where the silicon-containing solid is selected from the group consisting of silicon carbide and silicon.

11. The method of claim 9 where the temperature is between about 0° C. and about 200° C.

12. The method of claim 11 where the temperature is between about 20° C. and about 100° C.

13. A method of oxidizing materials whose oxidation requires a standard free energy change of less than about +636 kJ/mol comprising decomposing ozone in a microwave discharge cavity to produce an ozone decomposition product stream containing excited molecular oxygen and excited atomic oxygen selected from the group consisting of $O(^1D)$, $O(^1S)$ and combinations thereof, and reacting species in the ozone decomposition product stream with said material at a temperature under about 300° C. to produce an oxide of said material on its surface.

14. The method of claim 13 where the material is selected from the group consisting of silicon, silicon carbide, and diamond.

15. The method of claim 13 where the temperature is between about 0° C. and about 200° C.

16. The method of claim 15 where the temperature is between about 20° C. and about 100° C.

17. A method of generating $O(^1D)$ and $O(^1S)$ comprising leading a stream of ozone at a pressure up to about 1 torr into a microwave discharge cavity and decomposing the ozone in the microwave discharge cavity with microwave radiation to produce a stream containing $O(^1D)$ and $O(^1S)$.

* * * * *